United States Patent [19]

Forestieri et al.

[11] 4,040,867
[45] Aug. 9, 1977

[54] SOLAR CELL SHINGLE

[75] Inventors: Americo F. Forestieri, Berea; Anthony F. Ratajczak, Medina; Leroy G. Sidorak, Brookpark, all of Ohio

[73] Assignee: The United States of America as represented by the Administrator of the National Aeronautics and Space Administration, Washington, D.C.

[21] Appl. No.: 717,319

[22] Filed: Aug. 24, 1976

[51] Int. Cl.² .................... H01L 31/04; E04D 1/00
[52] U.S. Cl. ................... 136/89 P; 52/173 R; 52/518; 136/89 AC
[58] Field of Search ............ 136/89 P, 89 PC, 89 AC; 52/518, 173

[56] References Cited

U.S. PATENT DOCUMENTS

| 3,087,309 | 4/1963 | Toulmin, Jr. ............... 62/3 |
| 3,369,939 | 2/1968 | Myer ........................ 136/89 |
| 3,769,091 | 10/1973 | Leinkram et al. ........... 136/89 |
| 3,841,302 | 2/1974 | Falbel ...................... 126/270 |

Primary Examiner—John H. Mack
Assistant Examiner—Aaron Weisstuch
Attorney, Agent, or Firm—N. T. Musial; G. E. Shook; J. R. Manning

[57] ABSTRACT

A solar cell shingle may be made of an array of solar cells on a lower portion of a substantially rectangular shingle substrate made of fiberglass cloth or the like. The solar cells may be encapsulated in flourinated ethylene propylene (FEP) or some other weatherproof translucent or transparent encapsulant to form a combined electrical module and a roof shingle. The interconnected solar cells are connected to connectors at the edge of the substrate through a connection to a common electrical bus or busses. An overlap area is arranged to receive the overlap of a cooperating similar shingle so that the cell portion of the cooperating shingle may overlie the overlap area of the roof shingle. Accordingly the same shingle serves the double function of an ordinary roof shingle which may be applied in the usual way and an array of cooperating solar cells from which electrical energy may be collected.

6 Claims, 5 Drawing Figures

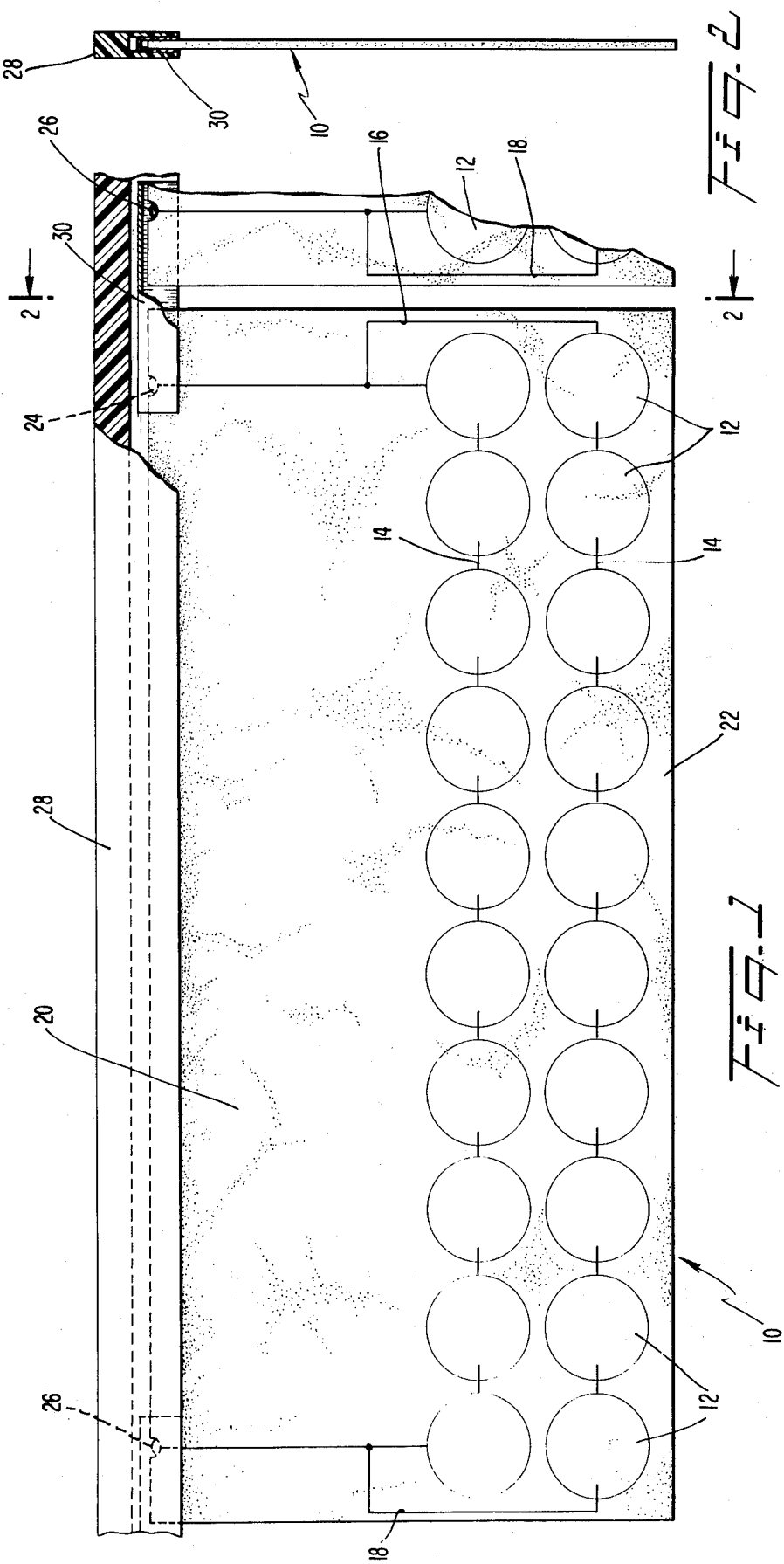

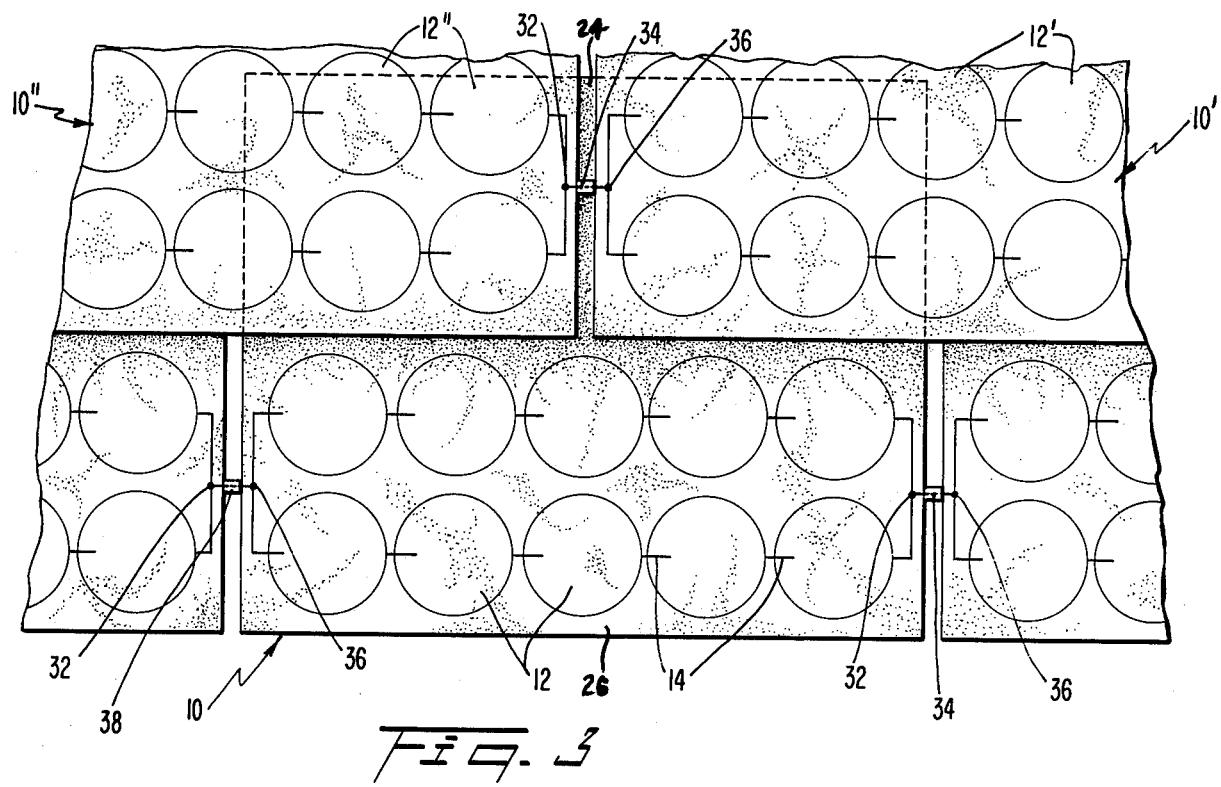
Fig. 3
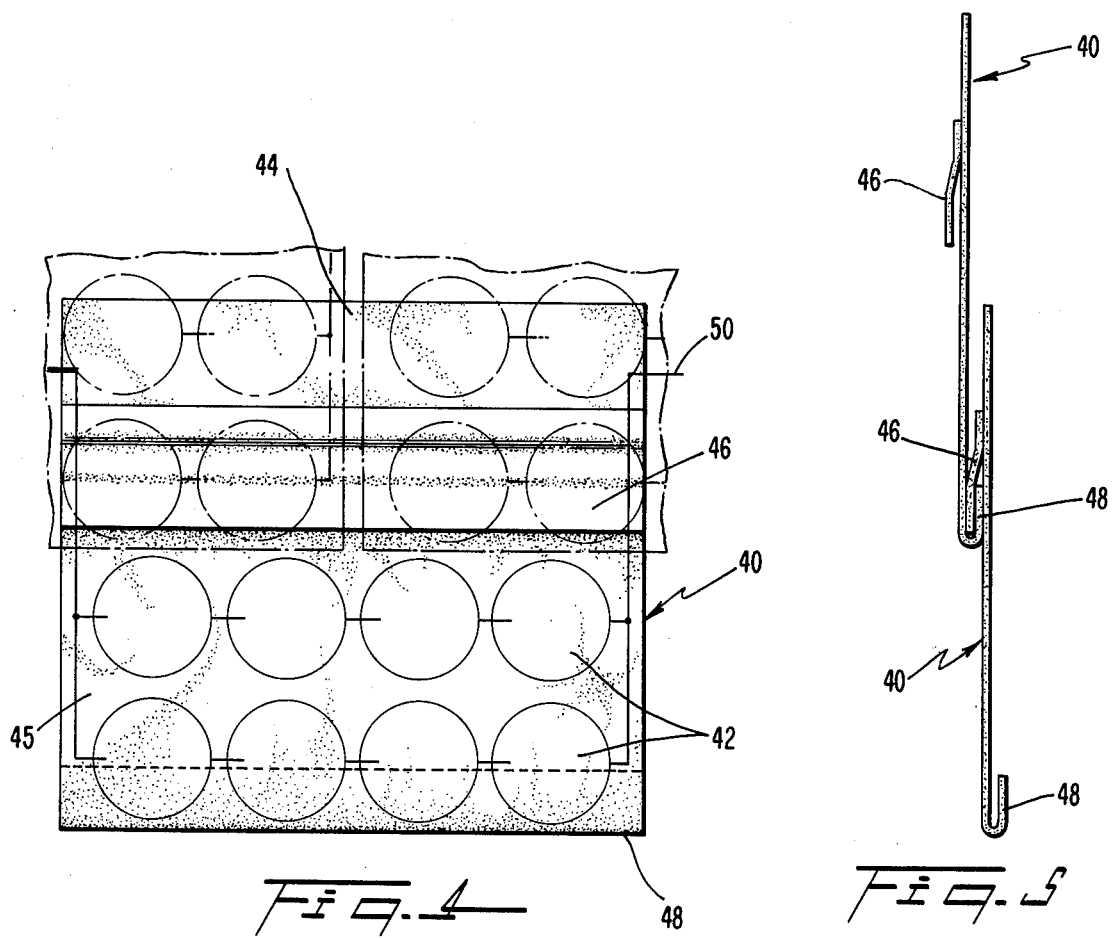
Fig. 4
Fig. 5

SOLAR CELL SHINGLE

ORIGIN OF THE INVENTION

The invention described herein was made by employees of the United States government and may be manufactured and used by or for the government for governmental purposes without the payment of any royalties thereon or therefor.

BACKGROUND OF THE INVENTION

The invention relates to solar cell arrays, particularly those which are designed for use on roofs or buildings. It has been heretofore suggested that solar cell arrays be arranged with solar cell wafers in stepped arrangement over a rooftop or the like. It has also been suggested to cover a helmet or the like with a solar cell array for the collection of radiant energy. Further suggestions involve building blocks or the like in which solar cells are encapsulated.

The suggested arrangements are difficult in their application to roofs and not readily intermixed with ordinary roofing shingles.

SUMMARY OF THE INVENTION

According to the present invention, a shingle is formed with two portions. One portion carries an array of solar cells to be exposed and the other is an overlap portion to be covered when applied to a roof or the like in the usual way of shingles. Such a shingle serves the function both of an ordinary roofing shingle and an array of solar cells for the collection of radiant energy.

BRIEF DESCRIPTION OF THE DRAWINGS

The foregoing and other objects, advantages and novel features of the invention will be more fully apparent from the following description when read in connection with the accompanying drawings in which:

FIG. 1 is a plan view of the preferred embodiment of a shingle according to the invention which is assembled with an edge connector which is used with a cooperating connector strip;

FIG. 2 is a sectional view of the assembly of FIG. 1 taken along the line 2—2 in FIG. 1;

FIG. 3 is a plan view of a shingle according to an alternate embodiment of the invention;

FIG. 4 is another embodiment of a shingle according to the invention which incorporates a shingle interlocking feature; and FIG. 5 is a side view of the shingle of FIG. 4.

DESCRIPTION OF THE PREFERRED EMBODIMENT

Referring now to FIG. 1, a rectangular shingle 10 comprises a substrate made of a pair of fiberglass cloth layers separated by a layer of a plastic material about 0.125 millimeters thick and on the outer surface of each fiberglass cloth layer a further layer of a plastic material of about 0.125 millimeters thick. A flourinated ethylene propylene copolymer described in U.S. Pat. No. 2,946,763 and known commercially as Teflon FEP has been a successful plastic material for this purpose. This construction provides a somewhat rigid substrate which lays flat and facilitates fabrication of the complete shingle.

On one side of the fiberglass cloth substrate thus partially prepared and on approximately one half of the exposed surface, a plurality of silicon solar cells 12 are arranged in a regular array of two rows, for example. The cells in a row are connected in series by conductors 14. The rows are connected together at the side edges of the shingles with conductors 16 and 18. The upper part of the shingle 10 is preserved as an overlap portion 20 thereby distinguishing it from the portion 22 which carries the array of solar cells 12. The arrays are electrically connected to connectors 24 and 26 at the top edge of the overlap portion 20. These connectors preferably comprise electrical contact pads.

A mechanical attachment strip 28 is provided having a U-shaped cross section containing a plurality of spring-clips 30 in which the electrical contact pads 24 and 26 are received. The attachment strip 28 is secured to the roof, and the shingles 10 are pressed into its slot with each clip 30 connecting the contact pad 24 on one shingle to the pad 26 on the adjacent shingle. Thus both mechanical and electrical attachments are made simultaneously, and the attachment strip 28 need not be an electrically conductive material. A plastic material extruded to the proper U-shaped configuration is satisfactory.

DESCRIPTION OF THE ALTERNATE EMBODIMENTS

In the arrangement of FIG. 3 a shingle 10 contains an array of solar cells 12. The shingle is constructed in a manner similar to that described in connection with the embodiment described above with the solar cells in rows. The rows are connected together at one side edge of each shingle at a junction 32 and terminated to extend just outside of the edge of the shingle in a male connecting element 34. At the other side edge, the interconnecting wires are formed at a junction 36 and thence brought to a female connector 38.

The upper part of the shingle shown in FIG. 3 is preserved as an overlap portion 24 as is the shingle of FIG. 1 thereby distinguishing it from the portion 26 which carries the array of solar cells 12. As illustrated, the portion 24 may be overlaid with other similar shingles, 10' and 10" which carry similar elements indicated by prime and double prime numbers respectively. It is contemplated that the junctions 32 and 36 may be in the portion 24 for protection.

It will be apparent from FIGS. 1 and 3 that the shingles 10 may be handled in much the same manner as ordinary roofing shingles and may indeed be of substantially the same directions. Accordingly, one may, if so desired, use the solar cell shingles on a portion of the roof and ordinary shingles on the remainder of the roof nailing them over the overlap portion or alternatively arranging the solar cell shingles over the overlap portion of an ordinary roofing shingle or interchanging them as may be desired to cover a specific area or proportion of the roof with the solar cell array shingles. As illustrated, electrical connections to the cells are brought out in a series parallel arrangement but it is obvious that other electrical connection arrangements, either all series, all parallel or different series parallel arrangements may be employed.

Referring now to FIGS. 4 and 5, the shingle 40 may be constructed of the same materials and thicknesses as described above for the shingle 10. The solar cells 42 may be mounted in the same fashion and an overlap area 44 may be left free of cells to serve the same function. In forming the shingles 40, a locking tab 46 is provided on the outer surface connected to the shingle at about the line between the overlap and solar cell array portions 44 and 45, preferably overlapping just into the cell portion 45, but not covering any cells 42. At the bottom of the shingle 40 on the unexposed side, a complementary hooked or folded over portion 48 is provided so that when the roof is being laid with the solar cell shingles such as 40 the hooked portions 48 may engage the tabs 46 to restrain the shingles from being blown upward and to prevent the wind from disturbing them. In this instance, a male connector 50 is brought out at one side but in the overlap area of the tab 46 so that it is covered and well-protected when the shingles are laid in the ordinary fashion with the succeeding rows displaced to cover the joint side-by-side shingles.

It will be apparent from the foregoing that a solar cell shingle according to the invention has the advantages of providing a shingle which may be used and applied in a substantially conventional manner and retains the advantages of an efficient solar cell array.

What is claimed is:

1. A solar cell shingle comprising a substrate having a cell portion and an adjacent overlap portion, an array of electrically interconnected solar cells mounted on said cell portion and connected to connectors on said shingle, whereby a like shingle may be arranged in overlapping relation on said overlap portion leaving said cells exposed.

2. A shingle as claimed in claim 1, said connectors comprising a male connector and a female connector.

3. A shingle as claimed in claim 1, said connectors comprising a male connector on one side edge of the shingle and a female connector on the other side edge of the shingle for interconnection to like shingles.

4. A shingle as claimed in claim 1, said connections leading to connector pads at the top edge of the overlap portion of said shingle.

5. The shingle as claimed in claim 4, and in combination therewith a connector strip having a channel and means for contacting said connector pads.

6. A solar cell shingle comprising a roofing material, an array of solar cells mounted on a first portion of said shingle, and a second portion of said shingle for receiving the overlap of a similar shingle.

* * * * *